United States Patent
Shimodaira

(10) Patent No.: US 10,027,308 B2
(45) Date of Patent: Jul. 17, 2018

(54) VIBRATION DEVICE, ELECTRONIC APPARATUS, AND MOBILE OBJECT

(71) Applicant: SEIKO EPSON CORPORATION, Tokyo (JP)

(72) Inventor: Kazuhiko Shimodaira, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 391 days.

(21) Appl. No.: 14/813,665

(22) Filed: Jul. 30, 2015

(65) Prior Publication Data
US 2016/0036411 A1    Feb. 4, 2016

(30) Foreign Application Priority Data

Jul. 30, 2014  (JP) .................................. 2014-154619

(51) Int. Cl.
| | |
|---|---|
| *H01L 41/053* | (2006.01) |
| *H03H 9/09* | (2006.01) |
| *H03H 9/08* | (2006.01) |
| *H03H 9/05* | (2006.01) |
| *H03H 9/10* | (2006.01) |

(52) U.S. Cl.
CPC ............ *H03H 9/09* (2013.01); *H03H 9/0528* (2013.01); *H03H 9/08* (2013.01); *H03H 9/1028* (2013.01)

(58) Field of Classification Search
USPC ........................................ 310/348, 346, 361
See application file for complete search history.

(56) References Cited

U.S. PATENT DOCUMENTS

| | | | | |
|---|---|---|---|---|
| 4,642,510 | A * | 2/1987 | Yamashita | ........... H03H 9/0514 310/344 |
| 5,917,272 | A | 6/1999 | Clark et al. | |
| 2004/0021402 | A1 | 2/2004 | Morley et al. | |
| 2006/0290239 | A1 | 12/2006 | Kasahara et al. | |
| 2007/0268078 | A1 | 11/2007 | Lee | |
| 2009/0058229 | A1 * | 3/2009 | Ibata | ....................... H01L 27/20 310/351 |
| 2014/0157370 | A1 | 6/2014 | Yamada | |
| 2015/0179919 | A1 * | 6/2015 | Kondo | ................. H03H 9/0547 310/343 |
| 2016/0056790 | A1 | 2/2016 | Yamada | |

FOREIGN PATENT DOCUMENTS

| | | |
|---|---|---|
| EP | 2 228 903 A1 | 9/2010 |
| JP | S50-094880 U | 8/1975 |
| JP | H03-088509 A | 4/1991 |
| JP | 2001-500715 A | 1/2001 |

(Continued)

*Primary Examiner* — Thomas Dougherty
(74) *Attorney, Agent, or Firm* — Oliff PLC

(57) ABSTRACT

A vibration device which is possible to secure the fixing of a vibrating element and to reduce deterioration in characteristics of the vibrating element includes a substrate, a plurality of elastic members each of which includes a connection portion connected to a first surface of the substrate, and a support portion extending from the connection portion to a position separated from the connection portion, and a vibrating element that is supported at the support portion, in which the vibrating element is supported by the plurality of elastic members via three or more support portions.

21 Claims, 13 Drawing Sheets

(56) References Cited

FOREIGN PATENT DOCUMENTS

| | | |
|---|---|---|
| JP | 2002-198739 A | 7/2002 |
| JP | 2005-528829 A | 9/2005 |
| JP | 2007-006270 A | 1/2007 |
| JP | 2007-312387 A | 11/2007 |
| JP | 2009-302701 A | 12/2009 |
| JP | 2010-213280 A | 9/2010 |
| JP | 2014-121039 A | 6/2014 |

* cited by examiner

VIBRATION DEVICE, ELECTRONIC APPARATUS, AND MOBILE OBJECT

CROSS REFERENCE

The entire disclose of Japanese Patent Application No. 2014-154619, filed Jul. 30, 2014, is expressly incorporated by reference herein.

BACKGROUND

1. Technical Field

The present invention relates to a vibration device, and an electronic apparatus and a mobile object using the vibration device.

2. Related Art

In the related art, a vibration device is disclosed in which a heating unit is provided on an active surface of an integrated circuit chip (an oscillation circuit element), and a vibrating element is directly connected to the active surface of the integrated circuit chip by using flip-chip bonding or a conductive adhesive so as to be heated (for example, refer to JP-A-2010-213280).

In the vibration device disclosed in JP-A-2010-213280, the vibrating element is directly fixed to the active surface of the integrated circuit chip in a cantilevered support manner. In the above-described manner, in a case where the vibrating element is directly fixed, it is hard for stress of the vibrating element caused by a temperature change or the like to be diffused from a fixed portion, and there is a concern that vibration characteristics of the vibrating element may deteriorate due to an influence of the stress. In order to reduce the influence of the stress on the vibrating element, it is effective to reduce the area of the fixed portion. However, in the above-described cantilevered support configuration in which the area of the fixed portion is reduced, there is a problem in that, in a case where an impact caused by a fall or the like occurs in the vibrating element, since impact stress concentrates on the cantilevered fixed portion, a defect such as deterioration in the connection strength between the vibrating element and the active surface of the integrated circuit chip tends to occur, and it is difficult to reduce the area of the fixed portion.

SUMMARY

An advantage of some aspects of the invention is to solve at least a part of the problems described above, and the invention can be implemented as the following forms or application examples.

Application Example 1

A vibration device according to this application example includes: a substrate; a plurality of elastic members each of which includes a connection portion connected to a first surface of the substrate, and a support portion extending from the connection portion to a position separated from the connection portion; and a vibrating element that is supported at the support portion. The vibrating element is supported by the plurality of elastic members via three or more support portions.

According to the vibration device of this application example, the vibrating element is connected to the three or more support portions of the plurality of elastic members connected to the base substrate, the support portions being provided so as to be separated from the connection portion. As mentioned above, the vibrating element is supported at the plurality of elastic members with respect to the base substrate and is also supported by the three or more support portions of the plurality of elastic members. In other words, the vibrating element is supported by the three or more support portions, and the three or more support portions are connected to the base substrate via the connection portions of the plurality of elastic members. Therefore, unlike a vibrating element which is supported at one side of the vibrating element, that is, cantilever-supported, the vibrating element of this application example is connected to the base substrate at least two positions, and, thus, even if stress is applied from outside, the stress can be distributed by the three or more support portions and the connection portions of the plurality of elastic members. For this reason, for example, it is possible to reduce a possibility that a vibration characteristic variation of the vibrating element or spurious may occur or to reduce a possibility that the support strength may deteriorate. In addition, stress caused by a thermal expansion change in the vibrating element due to a temperature change is absorbed or diffused by the elastic members, and thus it is possible to reduce deterioration in vibration characteristics of the vibrating element due to an influence of the stress. Since the vibrating element is supported by the elastic member, a vibration characteristic variation of the vibrating element, for example, the occurrence of spurious is reduced due to an effect or the like of buffering an impact force from outside, and thus it is possible to reduce the possibility that the support strength may deteriorate.

Application Example 2

In the application example described above, the elastic member may include a spring member that extends in an elongated shape in a plan view and is provided with a bent section.

According to this application example, the vibrating element is supported by the spring member that extends in an elongated shape in a plan view and is provided with a bent section. In the elastic member with such a configuration, since a degree of freedom of deformation (bending) caused by application of stress increases, absorption or diffusion of the stress is facilitated when the vibrating element is supported thereby, and it is possible to reduce deterioration in vibration characteristics of the vibrating element. An effect of buffering an impact force or the like can also be achieved, and thus it is possible to reduce a possibility that the support strength of the vibrating element may deteriorate.

Application Example 3

In the application example described above, the vibrating element may have a circular shape in a plan view, and the support portions are disposed in point symmetry with respect to a center of the circular shape.

According to this application example, the circular vibrating element is supported so as to be geometrically well balanced, and thus it is possible to reduce a possibility that stress such as an impact force applied to the vibrating device from outside may be unevenly applied to the vibrating element, and, for example, to reduce a possibility that the stress may be unevenly applied to one of the three or more support portions. Therefore, it is possible to reduce a possibility that the connection rigidity between the vibrating element and the support portions may decrease, or to reduce the occurrence or the like of spurious.

Application Example 4

In the application example described above, the vibrating element may include excitation electrodes on surfaces which are front and rear surfaces with respect to each other, and the elastic member is conductive, and at least one of the three or more support portions may be connected to at least one of the excitation electrodes via a conductive joining member.

According to this application example, since one of the excitation electrodes provided in the vibrating element can be electrically connected to the base substrate via the elastic member, the elastic member can be used for both fixation and electrical connection of the vibrating element, and thus the vibrating element can be efficiently disposed on the base substrate.

Application Example 5

In the application example described above, the vibrating element may include excitation electrodes on surfaces which are front and rear surfaces with respect to each other, and one of the excitation electrodes may be electrically connected to a connection electrode formed on the first surface by using wire bonding.

According to this application example, since the other of the excitation electrodes is connected to the connection electrode provided on the base substrate by performing wire bonding, a degree of freedom of electrical connection between the vibrating element and the base substrate is improved, and thus it is possible to increase a degree of freedom of a layout of the excitation electrodes of the vibrating element, or a degree of freedom of design of a layout of the connection electrode of the base substrate.

Application Example 6

In the application example described above, the vibrating element may include excitation electrodes on surfaces which are front and rear surfaces with respect to each other, the elastic member may be conductive, and at least one of the three or more support portions may be connected to one of the excitation electrodes via a conductive joining member, and the other of the excitation electrodes may be electrically connected to a connection electrode formed on the first surface by using wire bonding.

According to this application example, since one of the excitation electrodes provided in the vibrating element can be electrically connected to the base substrate via the elastic member, the elastic member can be used for both fixation and electrical connection of the vibrating element, and thus the vibrating element can be efficiently disposed on the base substrate. In addition, since the other of the excitation electrodes is connected to the connection electrode provided on the base substrate by using wire bonding, a degree of freedom of electrical connection between the vibrating element and the base substrate is improved, and thus it is possible to increase a degree of freedom of a layout of the excitation electrodes of the vibrating element, or a degree of freedom of design of a layout of the connection electrode of the base substrate.

Application Example 7

In the application example described above, a heating member may be provided on a second surface which is a rear surface of the first surface of the substrate.

According to this application example, it is possible to configure, for example, an oven controlled xtal oscillator (OCXO) which can control the temperature of the vibrating element provided in the vibration device to a desired temperature range by using the heating member. Heat from the heating member is conducted from the support portions of the elastic members to the vibrating element via the plurality of elastic members, and thus the heat can be easily transmitted to the vibrating element. Therefore, it is possible to provide the stable and highly accurate vibration device.

Application Example 8

In the application example described above, a lid body forming a storage space which stores the vibrating element therein may be joined to the first surface of the substrate, and the storage space may be air-tightly sealed.

According to this application example, it is possible to provide the vibration device in which the vibrating element is stored in the space which is air-tightly sealed by the lid body. In other words, the space in which the vibrating element is mounted is formed as a space which is air-tightly sealed, and thus it is possible to provide the vibration device which reduces an influence on the vibrating element from the outside.

Application Example 9

An electronic apparatus according to this application example includes the vibration device according to any one of the application examples described above.

According to the electronic apparatus of this application example, since the vibration device is used which can reduce deterioration in vibration characteristics due to stress or deterioration in vibration characteristics due to a fall impact or the like, it is possible to provide the electronic apparatus which enables characteristics to be more stable.

Application Example 10

A mobile object according to this application example includes the vibration device according to any one of the application examples described above.

According to the mobile object of this application example, since the vibration device is used which can reduce deterioration in vibration characteristics due to stress or deterioration in vibration characteristics due to a fall impact or the like, it is possible to provide the mobile object which enables characteristics to be more stable.

BRIEF DESCRIPTION OF THE DRAWINGS

The invention will be described with reference to the accompanying drawings, wherein like numbers reference like elements.

FIGS. 1A and 1B illustrate a schematic configuration of a vibration device according to a first embodiment, in which FIG. 1A is a plan view, and FIG. 1B is a sectional view taken along line A-A' illustrated in FIG. 1A.

FIGS. 3A and 3B illustrate an example of a plate spring, in which FIG. 3A is a plan view and FIG. 3B is a front view.

FIGS. 6A and 6B illustrate a schematic configuration of a vibration device according to a second embodiment, in which FIG. 6A is a plan view, and FIG. 6B is a sectional view taken along the line B-B' illustrated in FIG. 6A.

FIGS. 7A and 7B illustrate a schematic configuration of a vibration device according to a third embodiment, in which FIG. 7A is a plan view, and FIG. 7B is a sectional view taken along the line E-E' illustrated in FIG. 7A.

FIGS. 9A and 9B illustrate a modification example of the plate spring, in which FIG. 9A is a plan view, and FIG. 9B is a partially enlarged sectional view taken along the line F-F' illustrated in FIG. 9A.

DESCRIPTION OF EXEMPLARY EMBODIMENTS

Hereinafter, with reference to the drawings, embodiments of the invention will be described.

First Embodiment

Figure 1A:
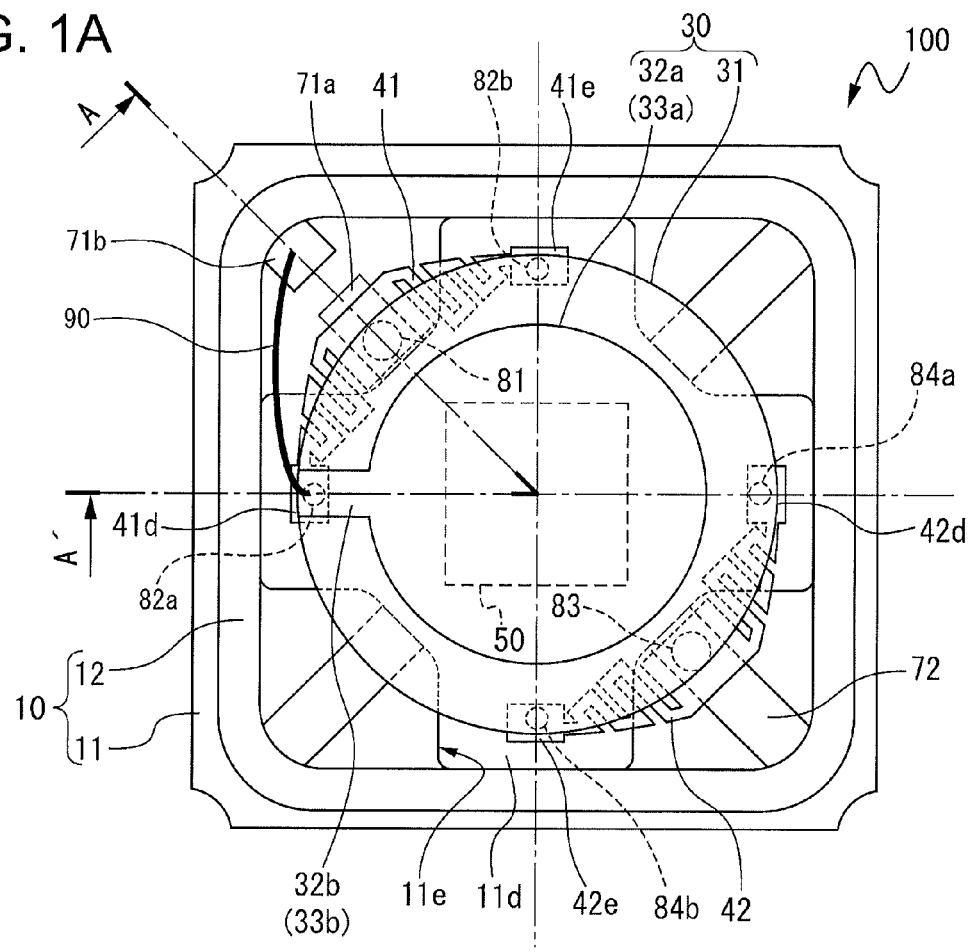
Figure 1B:
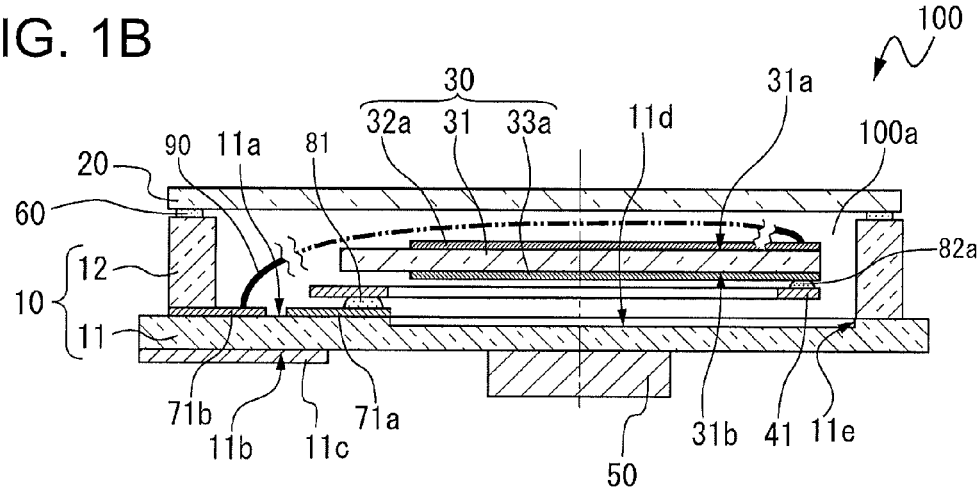

With reference to FIGS. 1A and 1B, a vibration device according to a first embodiment will be described. FIGS. 1A and 1B illustrate a schematic configuration of a vibration device according to the first embodiment, in which FIG. 1A is a plan view and FIG. 1B is a sectional view taken along the line A-A' illustrated in FIG. 1A. For better understanding of the figures, in FIG. 1A, a lid member is omitted (seen-through).

A vibration device 100 according to the first embodiment illustrated in FIGS. 1A and 1B includes a vibrating element 30 in which excitation electrodes 32a and 33a are formed on both planes of a vibration substrate 31; plate springs 41 and 42 as elastic members which support the vibrating element 30; a package 10 which stores the vibrating element 30 and the plate springs 41 and 42; and a lid 20 as a lid body which forms an internal space 100a as a storage space (a mounting space) along with the package 10. A heating element 50 as a heating member is provided on a second surface 11b of an external plane of a base substrate 11 as a substrate forming the package 10. Hereinafter, the vibrating element 30, the package 10, the plate springs 41 and 42, the heating element 50, and the lid 20 will be described sequentially in detail.

Vibrating Element

Figure 2A:
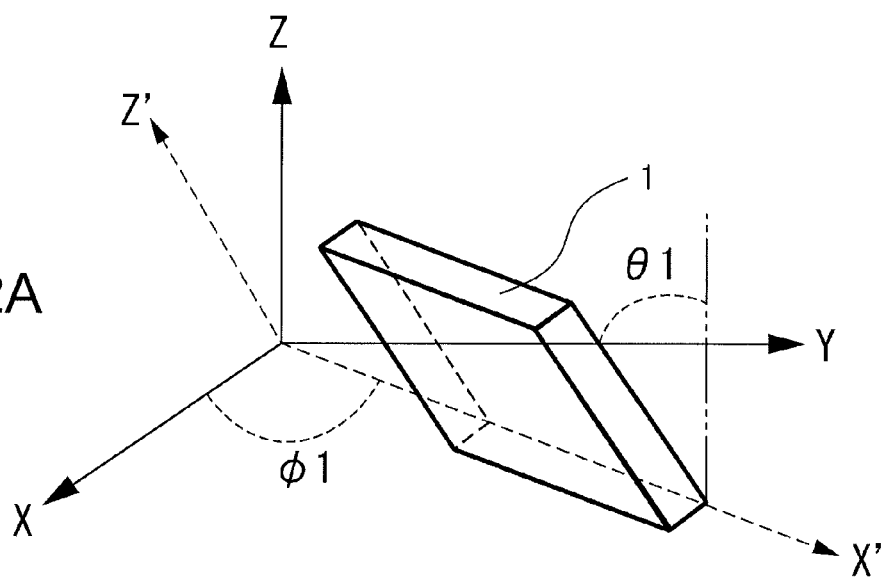
FIGS. 2A and 2B are schematic diagrams illustrating an SC cut quartz crystal substrate.
Figure 2B:
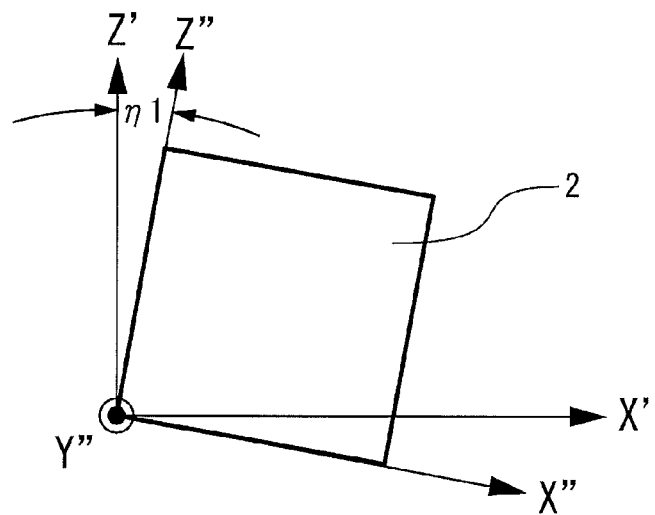

In the vibrating element 30 of the present embodiment, an SC cut quartz crystal substrate (piezoelectric substrate) made of quartz crystal as an example of a piezoelectric material is used in the vibration substrate 31. Here, the SC cut quartz crystal substrate (piezoelectric substrate) will be described with reference to FIGS. 2A and 2B. FIGS. 2A and 2B are schematic diagrams illustrating a configuration of the SC cut quartz crystal substrate. The configuration of the SC cut quartz crystal substrate is hard to understand and is thus illustrated to be divided into FIGS. 2A and 2B. As illustrated in FIG. 2A, an SC cut quartz crystal substrate 1 of this example is a quartz crystal substrate obtained through two rotations ($\phi1$ and $\theta1$) of the orthogonal coordinate system (X,Y,Z) and one successive rotation ($\eta1$) of the orthogonal coordinate system (X',Y",Z') as illustrated in FIG. 2B. A quartz crystal belongs to a trigonal system and has crystal axes X, Y, and Z which are perpendicular to each other. The X axis, the Y axis, and the Z axis are respectively referred to as an electrical axis, a mechanical axis, and an optical axis. The Z axis is a three-fold symmetry axis in which a set of the X axis and the Y axis is present every 120° about the Z axis, and the X axis is a two-fold symmetry axis. As illustrated in FIG. 2A, a configuration of the quartz crystal is described by using the orthogonal coordinate system (X,Y,Z) formed of the X axis as an electrical axis, the Y axis as a mechanical axis, and the Z axis as an optical axis.

As illustrated in FIG. 2A, in the SC cut quartz crystal substrate 1, first, a new orthogonal coordinate system (X,Y',Z') is obtained through rotation by a predetermined angle $\phi1$ (for example, 34°) about the X axis of the orthogonal coordinate system (X,Y,Z), and an orthogonal coordinate system obtained through rotation about the Z' axis of the new orthogonal coordinate system (X,Y',Z') by a predetermined angle $\theta1$ (for example, 22°) is set to (X',Y",Z'). The typical SC cut quartz crystal substrate 1 is obtained when cutting a rectangular substrate of which a thickness direction is parallel to a Y" axis direction, and both main surfaces include a X' Z' plane (a plane formed of the X' axis and the Z' axis).

As illustrated in FIG. 2B, a new orthogonal coordinate system (X",Y",Z") is obtained through rotation about the Y" axis of the orthogonal coordinate system (X',Y",Z') by an angle $\eta1$ in addition to the two rotations. An SC cut quartz crystal substrate 2 is also obtained when cutting a rectangular substrate of which a thickness direction is parallel to a Y" axis direction, and both main surfaces include a X"Z" plane (a plane formed of the X" axis and the Z" axis) in the new orthogonal coordinate system (X",Y",Z"). The SC cut quartz crystal substrate 2 of this example is a quartz crystal substrate which has the X" axis which is parallel to first two opposite sides of the rectangular SC cut quartz crystal substrate 1, Z" axis which is parallel to second two opposite sides thereof, and the Y" axis direction as a thickness direction. A plate which is cut out of the SC cut quartz crystal substrate 1 or the SC cut quartz crystal substrate 2 is used as the vibration substrate 31 (the vibrating element 30) of the present embodiment.

A quartz crystal substrate according to the first embodiment of the invention is not limited to the above-described SC cut quartz crystal substrate, and is widely applicable to other piezoelectric substrates such as an AT cut or BT cut quartz crystal substrate which vibrates in a thickness shear vibration manner. For example, in a case of the AT cut quartz crystal substrate, both of the Y axis and the Z axis are rotated about the X axis by about 35° 15' and are thus respectively generated as a Y' axis and a Z' axis. Therefore, the AT cut quartz crystal substrate has the crystal axes X, Y', and Z' which are perpendicular to each other. The AT cut quartz crystal substrate has a thickness direction parallel to the Y' axis direction, and a main surface including an XZ' plane (a plane including the X axis and the Z' axis) perpendicular to the Y' axis, and vibrates with thickness shear vibration as main vibration. The vibration substrate 31 as an element plate of the vibrating element 30 can be obtained by processing the AT cut quartz crystal substrate. As the vibrating element 30, in addition to the above-described ones, a surface acoustic wave resonator or a micro electromechanical system (MEMS) vibrating element may be used. As a substrate material of the vibrating element 30, not only the quartz crystal but also a piezoelectric material such as a piezoelectric single crystal of Lithium Tantalate or Lithium Niobate, or piezoelectric ceramics, for example, Zirconate Titanate, or a silicon semiconductor material may be used. As an excitation method of the vibrating element, a piezoelectric effect may be used, and electrostatic driving using a Coulomb force may be used.

As illustrated in FIGS. 1A and 1B, in the vibrating element 30 of the present embodiment, the excitation electrodes 32a and 33a and connection electrodes 32b and 33b are formed on a first main surface 31a and a second main surface 31b, which are front and rear surfaces with respect to each other, of the disc-shaped vibration substrate 31 formed of the above-described SC cut quartz crystal substrate 1. The excitation electrode 32a is substantially circular, and is formed at the center of the first main surface 31a (a front main surface) of the vibration substrate 31 (the vibrating element 30). In addition, the connection electrode 32b is formed on one outer circumferential end side of the first main surface 31a, and has one end which is connected to the excitation electrode 32a and the other end thereof provided so as to extend toward an outer edge of the vibration substrate 31. The excitation electrode 33a is substantially circular, and is formed at the center of the second main surface 31b (a rear main surface) of the vibration substrate 31 (the vibrating element 30) so as to nearly overlap the front excitation electrode 32a in a plan view. Further, the connection electrode 33b is formed on one outer circumferential end side of the second main surface 31b so as to nearly overlap the connection electrode 32b of the first main surface 31a in a plan view, and has one end which is connected to the excitation electrode 33a and the other end which is provided so as to extend toward the outer edge of the vibration substrate 31. The connection electrode 32b and the connection electrode 33b are not limited to being formed so as to nearly overlap each other in a plan view. The connection electrode 33b has only to be disposed at a position where the connection electrode 33b can be supported at the plate springs 41 and 42 so as to be electrically connected to other elements, and the connection electrode 32b and the connection electrode 33b may be disposed at different positions in a plan view.

Package

The package 10 illustrated in FIGS. 1A and 1B includes the base substrate 11 which is a substrate serving as a bottom plate, and a frame-shaped sidewall 12 which is provided on a circumferential edge section of a first surface 11a on which the vibrating element 30 is disposed and which is an opposite surface to a second surface 11b of the base substrate 11. The package 10 stores the vibrating element 30 therein. An upper surface of the sidewall 12 is provided with a sealing 60 which is a joining material.

The package 10 has a recess (the internal space 100a) as a storage space whose upper surface is open. The opening of the recess is closed by the lid 20 which is a lid member joined to the sidewall 12 via the sealing 60 which is a joining material. The opening of the recess of the package 10 is closed, and thus the sealed internal space 100a (storage space) is formed. Internal pressure of the sealed internal space 100a may be set to a desired atmospheric pressure. For example, the internal pressure is set to the atmospheric pressure by filling the internal space 100a with nitrogen gas, or the internal space 100a is made to enter a vacuum state (a state of the space filled with a gas with pressure ($1 \times 10^5$ Pa to $1 \times 10^{-10}$ Pa or lower (JIS Z 8126-1: 1999)) which is lower than the normal atmospheric pressure). Thus, the vibrating element 30 can continuously vibrate more stably. The internal space 100a of the present embodiment is set to the above-described vacuum state.

The frame-shaped sidewall 12 is circumferentially formed in a substantially square shape, and an opening shape which is open to the upper surface of the recess is substantially square. The recess surrounded by the tabular base substrate 11 and the sidewall 12 becomes the internal space (storage space) 100a for storing the vibrating element 30. The sealing 60 which is a joining member disposed on the upper surface of the sidewall 12 is made of, for example, an alloy such as Kovar. The sealing 60 functions as a joining member which joins the lid 20 as a lid member to the sidewall 12, and is formed in a frame shape (circumferentially formed in a substantially square shape in the present embodiment) along the upper surface of the sidewall 12. An opening shape of the sidewall 12 is not limited to a substantially square shape, but may have other shapes, and, in this case, the frame-shaped sealing 60 having a shape which is suitable for the opening shape of the sidewall 12 is used.

The package 10 is made of a material having a thermal expansion coefficient identical to that of the vibrating element 30 or the lid 20 or a thermal expansion coefficient which is as close as possible thereto, and ceramics are used in the present embodiment. The package 10 is formed by stacking a green sheet which is molded in a predetermined shape and sintering the stacked green sheets. For example, a kneaded mixture is generated by dispersing ceramic power in a predetermined solution and adding a binder thereto, and the green sheet is obtained by forming the kneaded mixture in a sheet shape.

At least pad electrodes 71a, 71b and 72 are provided on the first surface 11a of the base substrate 11 constituting the package 10. The pad electrode 71a is joined to the plate spring 41 via a conductive adhesive 81 which is a conductive joining member, and the pad electrode 71b is connected to one end of a bonding wire 90 which will be described later. The pad electrode 72 is joined to the plate spring 42 via a resin adhesive 83 which is a joining member. The pad electrodes 71a, 71b and 72 are formed, for example, by forming a necessary shape by using a conductive paste such as silver or palladium, or metalized tungsten, then by performing baking, and by performing plating with nickel and gold, silver, or the like. At least the pad electrodes 71a and 71b are electrically connected to an external connection electrode 11c formed on the second surface 11b of the base substrate 11, via lead wiring (not illustrated) formed in the package 10.

The pad electrode 71a is electrically connected to the connection electrode 33b of the excitation electrode 33a formed on the second main surface 31b of the vibration substrate 31 via the conductive adhesive 81, the plate spring 41, and a conductive adhesive 82a which is a joining member. The pad electrode 71b is electrically connected to the connection electrode 32b of the excitation electrode 32a formed on the first main surface 31a of the vibration substrate 31 via the bonding wire 90.

The pad electrode 72 forms a gap (clearance) at least between the first surface 11a of the base substrate 11 and the second main surface 31b of the vibration substrate 31 which oppose each other, and reduces the possibility that the vibrating element 30 and the base substrate 11 may come into contact with each other. In addition, the resin adhesive 83 is preferably coated on the pad electrode 72 of a metal surface in order to prevent the resin adhesive 83 from spreading. As mentioned above, if the plate spring 41 is connected onto the pad electrode 71a via the conductive adhesive 81, the plate spring 42 is connected onto the pad electrode 72 via the resin adhesive 83. Thus, the plate spring 41 and the plate spring 42 are disposed on the base substrate 11 by using the same constituent member. In other words, since the plate spring 41 and the plate spring 42 can be maintained in a state of being substantially parallel to the first surface 11a of the base substrate 11 and a bottom surface of a concave portion 11d, the vibration substrate 31 which is connected to the plate spring 41 via the conductive adhesive 81 and is connected to the plate spring 42 via the resin adhesive 83 can also be maintained in a state of being substantially parallel to the first surface 11a of the base substrate 11 and the bottom surface of the concave portion 11d. Consequently, the vibration substrate 31 and the base substrate 11 can be maintained to be substantially parallel to each other, and thus it is also possible to reduce the possibility that the first surface 11a of the base substrate 11 may come into contact with the second main surface 31b of the vibration substrate 31. The conductive resin adhesive 83 is used in a case where the pad electrode 72 is joined as a ground electrode of the vibrating element 30, but an insulating joining material may be used in a case where electrical connection is not necessary.

Plate Springs

Figure 3A:
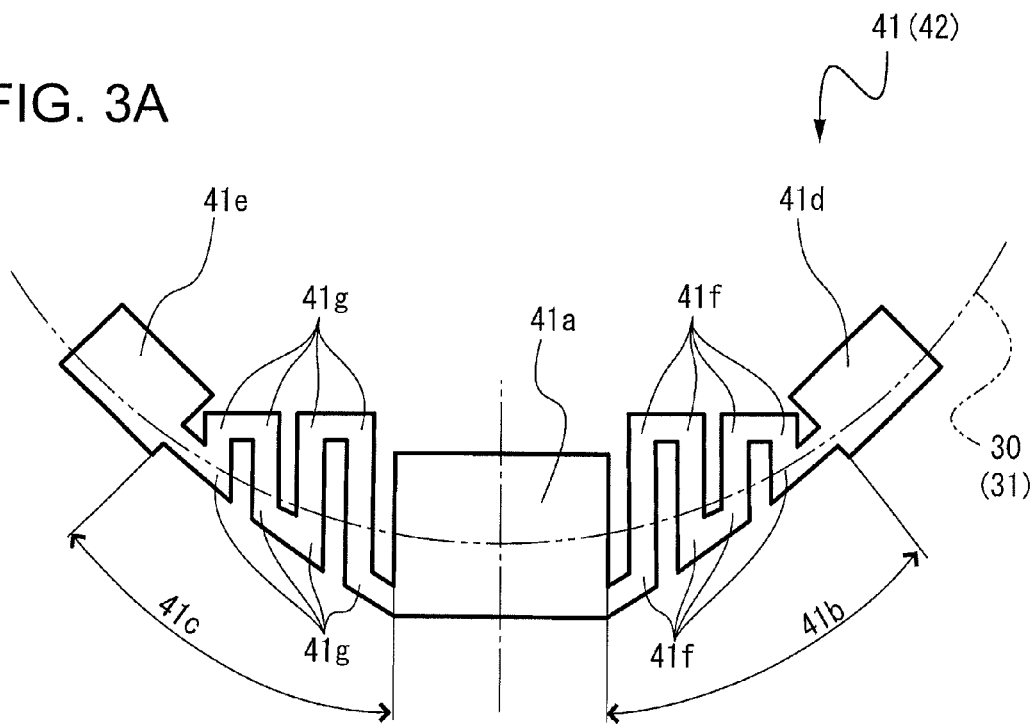
Figure 3B:
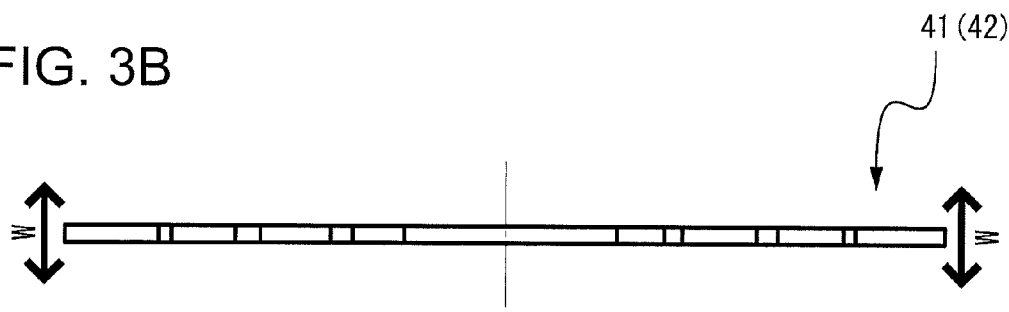

Here, with reference to FIGS. 3A and 3B, details of the plate springs 41 and 42 will be described. FIGS. 3A and 3B illustrate an example of the plate spring, in which FIG. 3A is a plan view and FIG. 3B is a front view. Since the plate spring 41 and the plate spring 42 have the same configuration, only the plate spring 41 will be described, and description of the plate spring 42 will be omitted.

The plate spring 41 is made of a plate material which is about 0.05 mm thick, and includes a base 41a, and, as illustrated in FIGS. 3A and 3B, a first support arm 41b and a second support arm 41c as two support arms which extend in directions separating from each other from the base 41a. A first support portion 41d extends from an extending end of the first support arm 41b, and a second support portion 41e extends from an extending end of the second support arm 41c. The first support portion 41d and the second support portion 41e support the vibrating element 30.

The first support arm 41b is provided with a plurality of bent portions 41f which are narrow and elongated. Similarly, the second support arm 41c is also provided with a plurality of bent portions 41g which are narrow and elongated. As mentioned above, since the plurality of bent portions 41f and 41g are respectively provided at the first support arm 41b and the second support arm 41c, the plate spring 41 can be more easily bent in an arrow W direction illustrated in FIG. 3B, and thus it is possible to further achieve a buffering effect with respect to vibration of the vibrating element 30 in the W direction or movement due to disturbance when the vibrating element 30 is connected to the plate spring 41. The first support arm 41b and the second support arm 41c preferably extend along the outer edge of the vibrating element 30 as illustrated in FIG. 3A. If the first support arm 41b and the second support arm 41c preferably extend along the outer edge of the vibrating element 30, the rigidity of the first support arm 41b and the second support arm 41c can be increased in a direction (a direction intersecting the W direction) along the plane of the plate spring 41, and thus it is possible to provide the vibration device 100 which is hardly influenced by disturbance in a direction intersecting an excitation direction of the vibrating element 30.

Outer shapes of plate springs 41 and 42 are formed by performing an etching process on a plate material having elasticity, such as phosphor bronze as an example of a copper alloy. Material for the plate springs 41 and 42 is not particularly limited as long as the material is elastic, but copper or a copper alloy (for example, beryllium copper) is preferably used. If copper, phosphor bronze, or a copper alloy such as beryllium copper which is highly conductive and has good heat conductivity and favorable elasticity and is thus used in the plate springs 41 and 42, it is possible to ensure conductivity of heat energy from the heating element 50 to the vibrating element 30 and also to alleviate stress in the vibrating element 30. In addition, the tabular plate springs 41 and 42 have been described as an example of an elastic member, but the elastic member is not limited thereto and has only to be elastically deformed. Further, a bar shape, a coil shape, a bellows shape, and a shape in which a hole penetrating through a tabular member is formed may be employed.

Attachment of Vibrating Element

The vibrating element 30 is stored in the recess surrounded by the sidewall 12 of the package 10. In the vibrating element 30, the connection electrode 33b on the second main surface (rear main surface) 31b is connected to the first support portion 41d via a conductive adhesive 82a containing, for example, a polyimide resin as a joining member. The vibrating element 30 is connected to the second support portion 41e via a resin adhesive 82b as a joining member. As mentioned above, since the vibrating element 30 is connected to the first support portion 41d of the plate spring 41 via the conductive adhesive 82a containing the resin, the resin contained in the conductive adhesive 82a can alleviate stress in the vibrating element 30 and can also ensure electrical conduction. Since the connection at the second support portion 41e does not require electrical conduction, the resin adhesive 82b as a joining member may not have conductivity.

Figure 4:
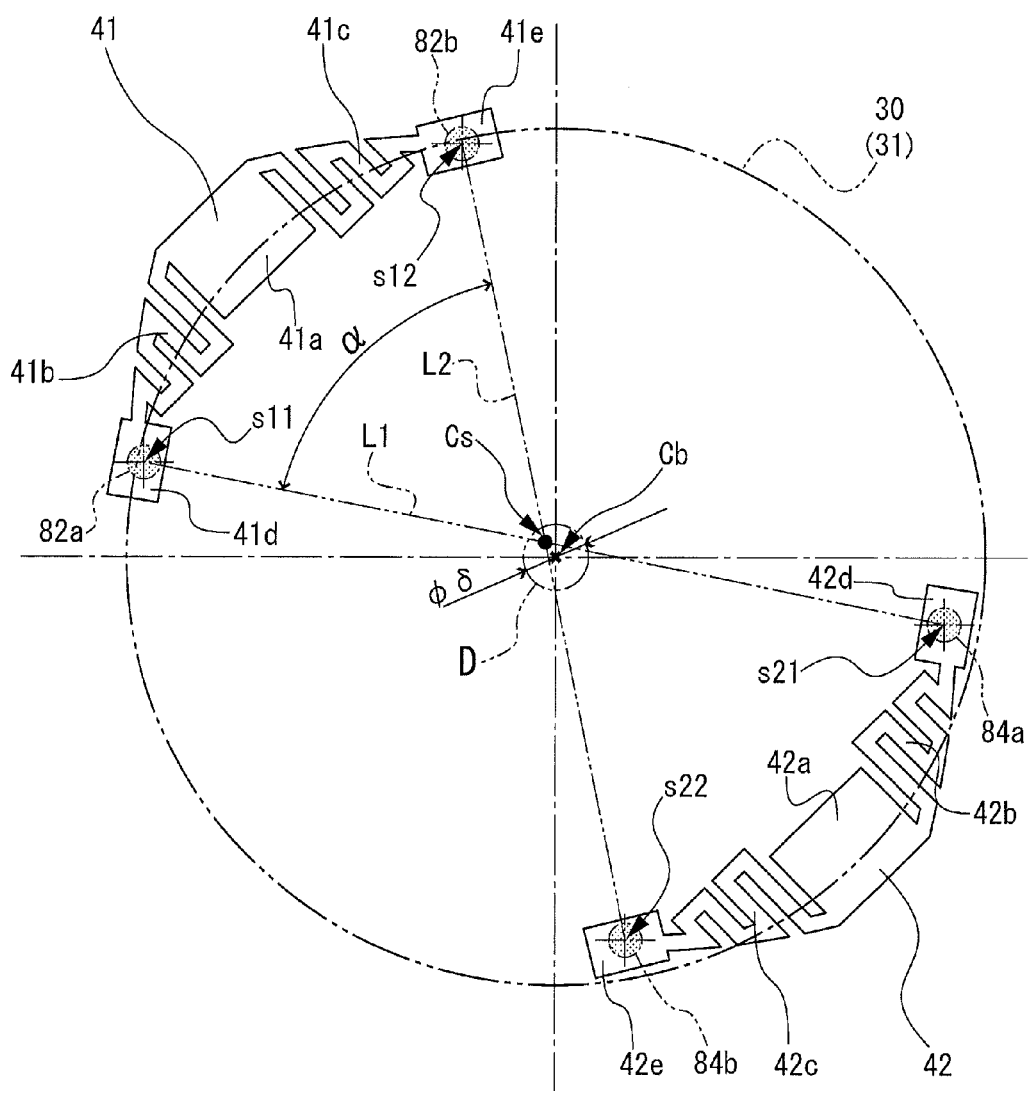
FIG. 4 is a conceptual plan view illustrating an arrangement in which a vibrating element is attached to the plate spring.

FIG. 4 is a conceptual plan view illustrating an arrangement in which the vibrating element 30 is attached to the plate springs 41 and 42. As illustrated in FIGS. 1A and 1B, in the vibration device 100 according to the present embodiment, the vibrating element 30 is formed by using the vibration substrate 31 having a substantially circular exterior. The vibrating element 30 is connected to and supported at the support portions 41d, 41e, 42d and 42e of the plate springs 41 and 42. Therefore, the support portions 41d, 41e, 42d and 42e are preferably balanced and arranged in a plan view of the vibrating element 30.

For example, as illustrated in FIG. 4, a coating center s11 of the conductive adhesive 82a which connects the first support portion 41d provided at the end of the first support arm 41b of the plate spring 41 to the vibrating element 30 is disposed in point symmetry to a coating center s21 of the resin adhesive 84a which connects the first support portion 42d provided at the end of the first support arm 42b of the plate spring 42 to the vibrating element 30 with respect to planar center Cb of the vibrating element 30. Similarly, coating center s12 of the resin adhesive 82b which connects the second support portion 41e provided at the end of the second support arm 41c of the plate spring 41 to the vibrating element 30 is disposed in point symmetry to a coating center s22 of the resin adhesive 84b which connects the second support portion 42e provided at the end of the second support arm 42c of the plate spring 42 to the vibrating element 30 with respect to the planar center Cb of the vibrating element 30.

In the above-described way, the coating centers s11, s12, s21 and s22 are disposed in point symmetry to each other with respect to the planar center Cb of the vibrating element 30, and thus the vibrating element 30 can be supported in a stable manner. In addition, disposing the coating centers s11, s12, s21 and s22 in point symmetry to each other may include that an intersection Cs between a virtual line L1 connecting s11 to s21 and a virtual line L2 connecting s12 to s22 is disposed within a region D which has a diameter $\phi\delta$ and has the center Cb of the vibrating element 30 as the center thereof, and, strictly, the intersection Cs may not overlap the center Cb. $\phi\delta$ is set to an allowable range corresponding to process capacity such as variations in manufacturing, and $\delta \cong 1$ mm in a case where an exterior (diameter) of the vibrating element 30 is 8 mm. In other words, 8 may be set to about 12.5% of the exterior (diameter) of the vibrating element 30.

When the number of supported locations on which adhesives adjacent to each other in a plan view are applied and which are supported by the support portions is set to n, an angle of $\alpha°$ formed by line segments connecting the adjacent supported locations to the intersection Cs or the center Cb is preferably $\alpha° \cong 360/n$. For example, in the vibrating element 30 illustrated in FIG. 4, the supported locations are four locations including the coating centers s11, s12, s21 and s22, that is, n=4, and, thus, preferably, $\alpha° \cong 90°$. As mentioned above, the coating centers s11, s12, s21 and s22 are disposed as the supported locations, and thus the vibrating element 30 can be supported so as to be well balanced by the plate springs 41 and 42.

The above-described method of disposing the coating centers s11, s12, s21 and s22 as the supported locations can be said to dispose the coating centers s11, s12, s21 and s22 in rotational symmetry to each other with respect to the center Cb of the vibrating element 30. Since the coating centers s11, s12, s21 and s22 are disposed in rotational symmetry to each other, the vibrating element can be supported in well balance even if the number of supported locations is odd. For example, in a case where the number of supported locations is 3, $\alpha°$ is set to $\alpha° \cong 360°/3 \cong 120°$, and thus the vibrating element 30 can be supported in well balance.

The bases 41a and 42a of the plate springs 41 and 42 are fixed to the base substrate 11, the vibrating element 30 is supported by the support portions 41d, 41e, 42d and 42e, and the vibrating element 30 is disposed in the hollow region of the package 10. Therefore, it is possible to increase a so-called buffering action in which an impact force caused by stress such as a fall impact being applied to the vibration device 100 is absorbed by the elasticity of the plate springs 41 and 42 so that the impact force applied to the vibrating element 30 is reduced. In this action, as described above, the vibrating element 30 is disposed by taking into consideration arrangement balance of the supported locations, and thus it is possible to reduce the possibility that stress such as an impact force from the outside of the vibrating element 30 may be unevenly applied to the vibrating element 30. Therefore, it is possible to reduce a possibility that the connection rigidity between the vibrating element 30 and the support portions 41d, 41e, 42d and 42e may decrease, or to reduce a possibility that noise, for example, spurious may occur.

As illustrated in FIGS. 1A and 1B, the concave portion lid may be provided on the first surface 11a side of the base substrate 11 in order to reduce unintended contact between the vibrating element 30 and the base substrate 11 due to an impact force or the like applied to the vibration device 100 from the outside. As illustrated in FIG. 1A, the concave portion 11d is formed in a tabular shape having a concave portion sidewall 11e so as to form a region which does not interfere with at least the support portions 41d, 41e, 42d and 42e of the plate springs 41 and 42.

Lid as Lid Body

The lid 20, which is a tabular member, closes the opening of the recess (storage space) which is open to the upper surface of the package 10, and is joined to the periphery of the opening of the recess by using, for example, a seam welding method. The lid 20 of the present embodiment has a tabular shape and is thus easily formed and has good shape stability. Kovar is used as the material for the lid 20 of the present embodiment. Since the Kovar plate is used in the lid 20, the sealing 60 made of Kovar and the lid 20 are melted into the same state during sealing, and are easily metalized. Thus, the sealing can be easily and reliably performed. Plates of other materials may be used in the lid 20 instead of Kovar. For example, a metal material such as 42 alloy or stainless steel, or the same material as that of the sidewall 12 of the package 10, that is, a ceramic or the like may be used. Joining between the lid 20 and the package 10 is not limited to the above-described seam welding method. For example, the joining may be performed by using a joining member which functions as an adhesive such as a resin or glass, and, in the case of using the resin or the glass as a joining member between the lid 20 and the package 10, the lid 20 may be made of a resin or glass.

Heating Element

Figure 5:
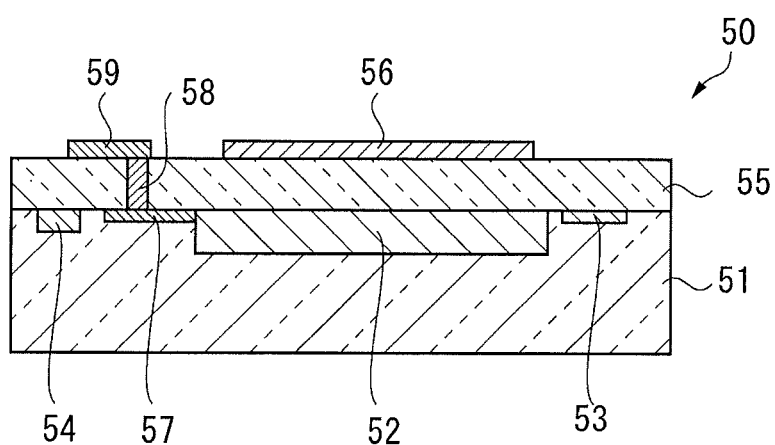
FIG. 5 is a front sectional view schematically illustrating a heating element.

A description will be made of an outline of the heating element as a heating member with reference to FIG. 5. FIG. 5 is a front sectional view schematically illustrating the heating element as a heating member. The heating element 50 illustrated in FIG. 5 is an electronic component which has a so-called thermostatic function of heating the vibrating element 30 connected thereto via the plate springs 41 and 42 which are connected to the base substrate 11 so as to maintain the temperature of the vibrating element 30 to be constant.

As illustrated in FIG. 5, in the heating element 50 as a base body, a heating body 52 constituted by a power transistor, a heating resistor, or the like, a temperature sensor 53, a functional element 54, and the like are disposed on a functional surface side of a substrate 51 made of a semiconductor or the like. The heating body 52 is temperature-controlled on the basis of a signal detected by the temperature sensor 53 so as to maintain a constant temperature. An intermediate layer 55 which is an electrical insulator is provided on the functional surface. A heat conductive layer 56 provided so as to oppose the heating body 52, and an external connection electrode 59 which is connected to the heating body 52, the functional element 54, or the like by using a connection wiring layer 57, and other wiring layers (not illustrated), a through electrode 58, or the like, are disposed on an upper surface of the intermediate layer 55. Since the heat conductive layer 56 is disposed so as to oppose the heating body 52, heat (heat energy) from the heating body 52 can be transmitted to the heat conductive layer 56 over a wide area. In other words, the heat from the heating body 52 can be efficiently transmitted to the heat conductive layer 56. The heating element 50 may have other configurations such as a configuration in which the above-described intermediate layer 55 is not provided. The heating element 50 has only to include at least the heating body 52, and the heating body 52, the temperature sensor 53, the functional element 54, and the like may be not provided on the same substrate 51.

As illustrated in FIGS. 1A and 1B, in the heating element 50, the heat conductive layer 56 is tightly adhered to the second surface 11b of the base substrate 11 constituting the package 10, and is fixed thereto by using a resin adhesive (not illustrated). The external connection electrode 59 provided in the heating element 50 is electrically connected to a heating element connection electrode which is not illustrated in FIG. 1A or 1B and is electrically connected to an external connection electrode 11c provided on the second surface 11b of the base substrate 11 of the package 10.

The heat (heat energy) from the heating element 50 is transmitted to the base substrate 11 via the heat conductive layer 56, the external connection electrode 59, or the like. The heat transmitted to the base substrate 11 is unlikely to be transmitted to the internal space 100a which is kept vacuum sealed and air-tight and is thus transmitted to the bases 41a and 42a of the plate springs 41 and 42 fixed to the first surface 11a of the base substrate 11 via the pad electrodes 71a and 72.

As described above, since the plate springs 41 and 42 are made of a metal such as phosphor bronze, that is, a material with high heat conductivity, the heat transmitted to the bases 41a and 42a is efficiently transmitted to the support portions 41d, 41e, 42d and 42e. The heat from the heating element 50 is delivered from the support portions 41d, 41e, 42d and 42e to the vibrating element 30.

Since the support portions 41d, 41e, 42d and 42e of the plate springs 41 and 42 are disposed in well balance with respect to the vibrating element 30 as described in FIG. 4, the heat transmitted from the heating element 50 is easily transmitted to the vibrating element 30, and thus the vibrating element 30 can be easily heated, or uneven heat (temperature) distribution in the vibrating element 30 can be reduced. Therefore, it is possible to obtain stable vibration characteristics.

Second Embodiment

Figure 6A:
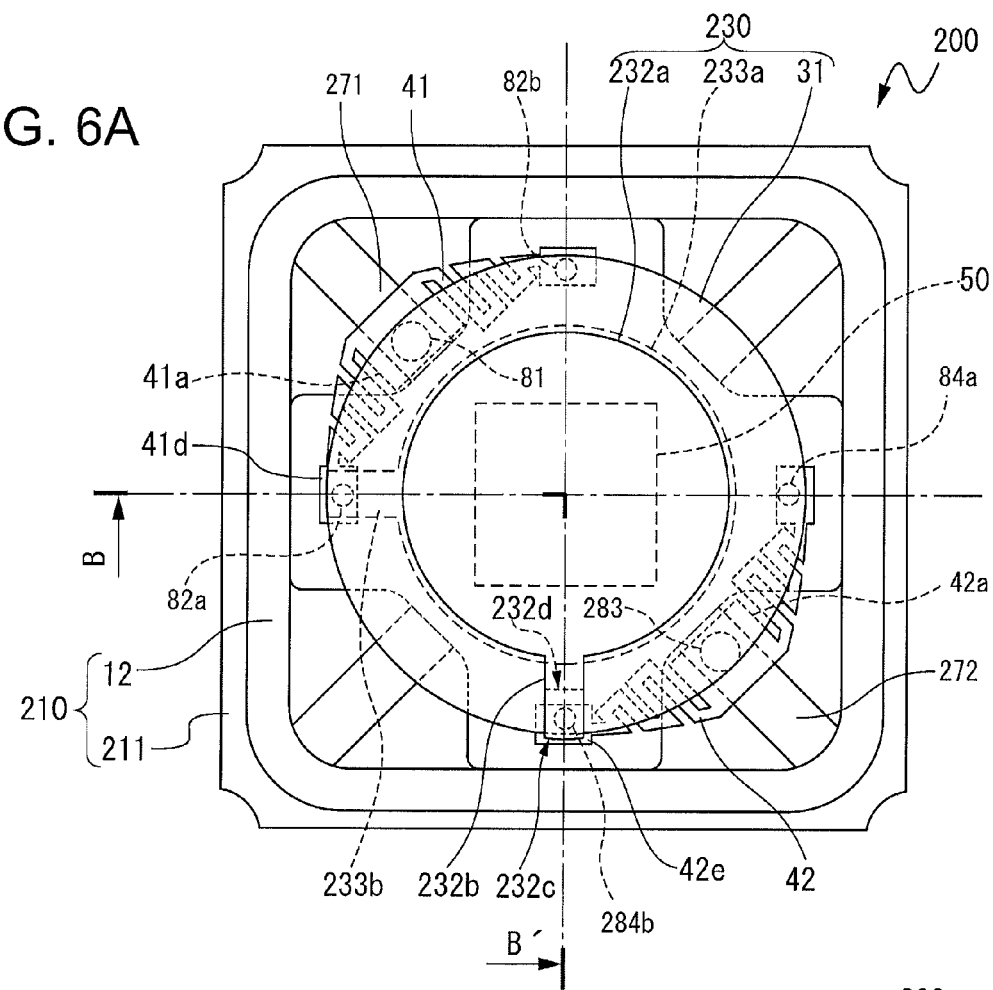
Figure 6B:
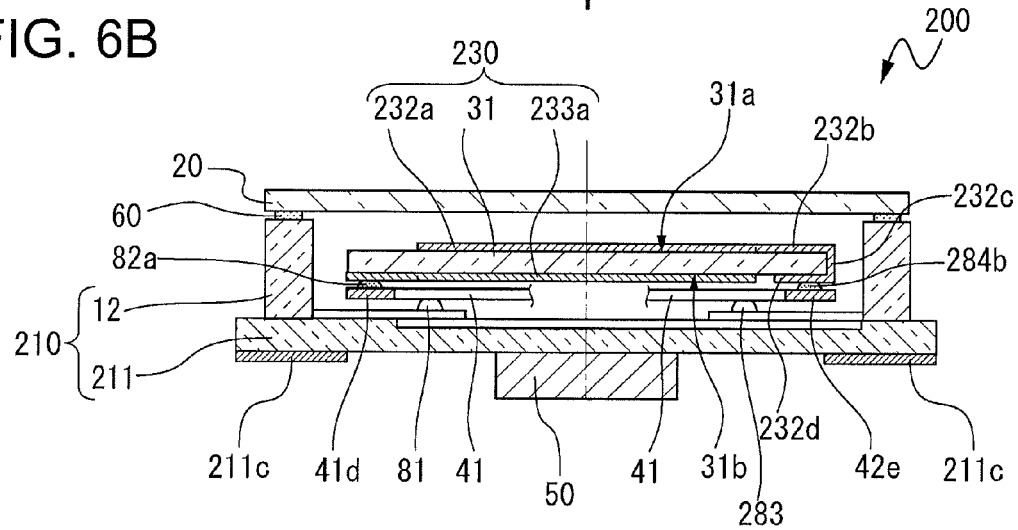

FIGS. 6A and 6B illustrate a vibration device 200 according to a second embodiment, in which FIG. 6A is a plan view and FIG. 6B is a sectional view taken along the line B-B' illustrated in FIG. 6A. For better understanding of the figures, in FIG. 6A, a lid member is omitted (seen-through). The vibration device 200 according to the second embodiment is different from the vibration device 100 according to the first embodiment in terms of the form of the vibrating element 30, and remaining constituent elements common to the constituent elements of the vibration device 100 according to the first embodiment are given the same reference numerals, and description thereof will be omitted.

As illustrated in FIG. 6A, in a case of the vibration device 200 according to the present embodiment, in a mounted vibrating element 230, a connection electrode 232b extending from an excitation electrode 232a formed on the first main surface 31a of the vibration substrate 31 is disposed and formed so as not to overlap a connection electrode 233b extending from an excitation electrode 233a formed on the second main surface 31b.

A connection side surface electrode 232c which goes around the outer circumferential surface of the vibration substrate 31 extends from the connection electrode 232b formed on the first main surface 31a, and a rear surface electrode 232d is further formed which extends from the connection side surface electrode 232c to the second main surface 31b of the vibration substrate 31. The rear surface electrode 232d is fixed to the second support portion 42e of the plate spring 42 via a conductive adhesive 284b so as to be electrically connected thereto. The excitation electrode 233a formed on the second main surface 31b of the vibration substrate 31 is fixed to the first support portion 41d of the plate spring 41 by the connection electrode 233b extending from the excitation electrode 233a via the conductive adhesive 82a so as to be electrically connected thereto.

In the plate spring 41, the base 41a is fixed to a pad electrode 271 via the conductive adhesive 81 so as to be electrically connected thereto. The pad electrode 271 is electrically connected to any one of external connection electrodes 211c formed outside a base substrate 211 via an internal wiring (not illustrated) in a package 210. In the plate spring 42, the base 42a is fixed to a pad electrode 272 via a conductive adhesive 283 so as to be electrically connected thereto. The pad electrode 272 is electrically connected to any one of the external connection electrodes 211c formed outside the base substrate 211 via an internal wiring (not illustrated) in the package 210.

As described above, in the vibration device 200 according to the second embodiment, without using a bonding wire for electrical connection between the excitation electrodes 232a and 233a and the pad electrodes 271 and 272, the connection electrode 233b and the rear surface electrode 232d are directly connected and fixed to the first support portion 41d of the plate spring 41 and the second support portion 42e of the plate spring 42 via the conductive adhesives 82a and 284b, and thus the vibrating element 230 can be supported by the plate spring 41 and the plate spring 42 so as to be geometrically well balanced. Therefore, it is possible to reduce the possibility that the connection rigidity between the vibrating element and the support portions may decrease due to stress such as an impact force, or to reduce the possibility that spurious and the like may be generated when the vibrating element 230 is excited by making vibration balance of the vibrating element 230 more favorable.

Third Embodiment

Figure 7A:
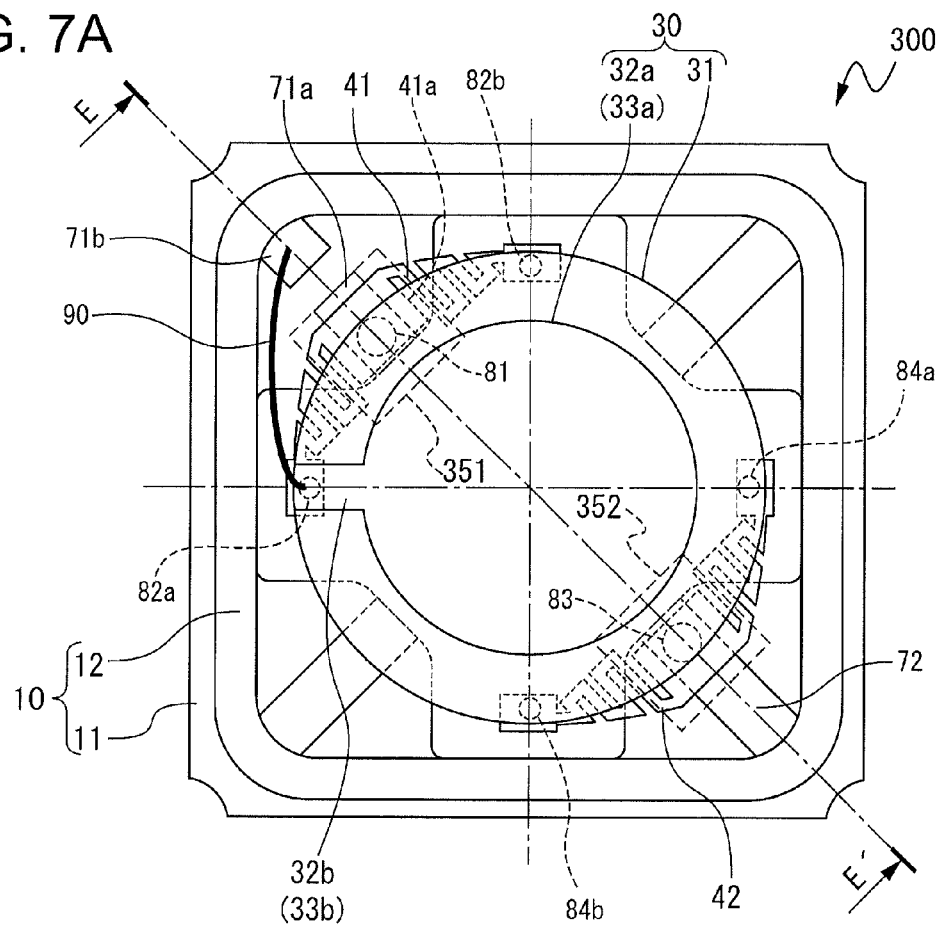
Figure 7B:
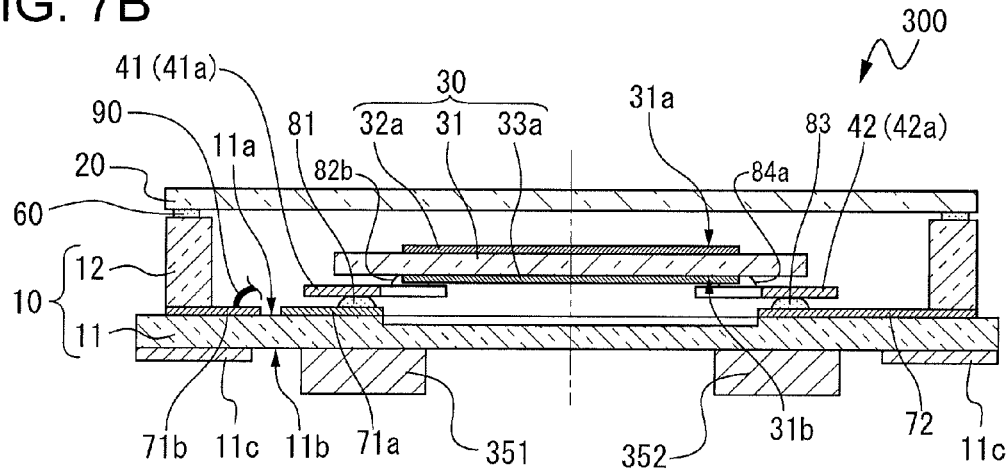

FIGS. 7A and 7B illustrate a vibration device 300 according to a third embodiment, in which FIG. 7A is a plan view and FIG. 7B is a sectional view taken along the line E-E' illustrated in FIG. 7A. For better understanding of the figures, in FIG. 7A, a lid member is omitted (seen-through). The vibration device 300 according to the third embodiment is different from the vibration device 100 according to the first embodiment in terms of the form of the heating element 50, and remaining constituent elements common to the constituent elements of the vibration device 100 according to the first embodiment are given the same reference numerals, and description thereof will be omitted.

As illustrated in FIGS. 7A and 7B, the vibration device 300 according to the third embodiment includes two heating elements 351 and 352. As illustrated in FIG. 7A, in a plan view of the vibration device 300, the first heating element 351 is disposed so as to overlap the base 41a of the plate spring 41 and the conductive adhesive 81 via which the base 41a is fixed and adhered, and the second heating element 352 is disposed so as to overlap the base 42a of the plate spring 42 and the resin adhesive 83 via which the base 42a is fixed and adhered.

Since the heating elements 351 and 352 are disposed as illustrated in FIGS. 7A and 7B, the heating elements 351 and 352 and the bases 41a and 42a of the plate springs 41 and 42 are disposed so as to be close to each other, and thus heat from the heating elements 351 and 352 can be easily conducted to the plate springs 41 and 42. Therefore, since heat conduction from the heating elements 351 and 352 to the vibrating element 30 is facilitated via the plate springs 41 and 42, the temperature of the vibrating element 30 can be more accurately controlled, or uneven heat (temperature) distribution in the vibrating element 30 can be reduced.

Fourth Embodiment

Figure 8:
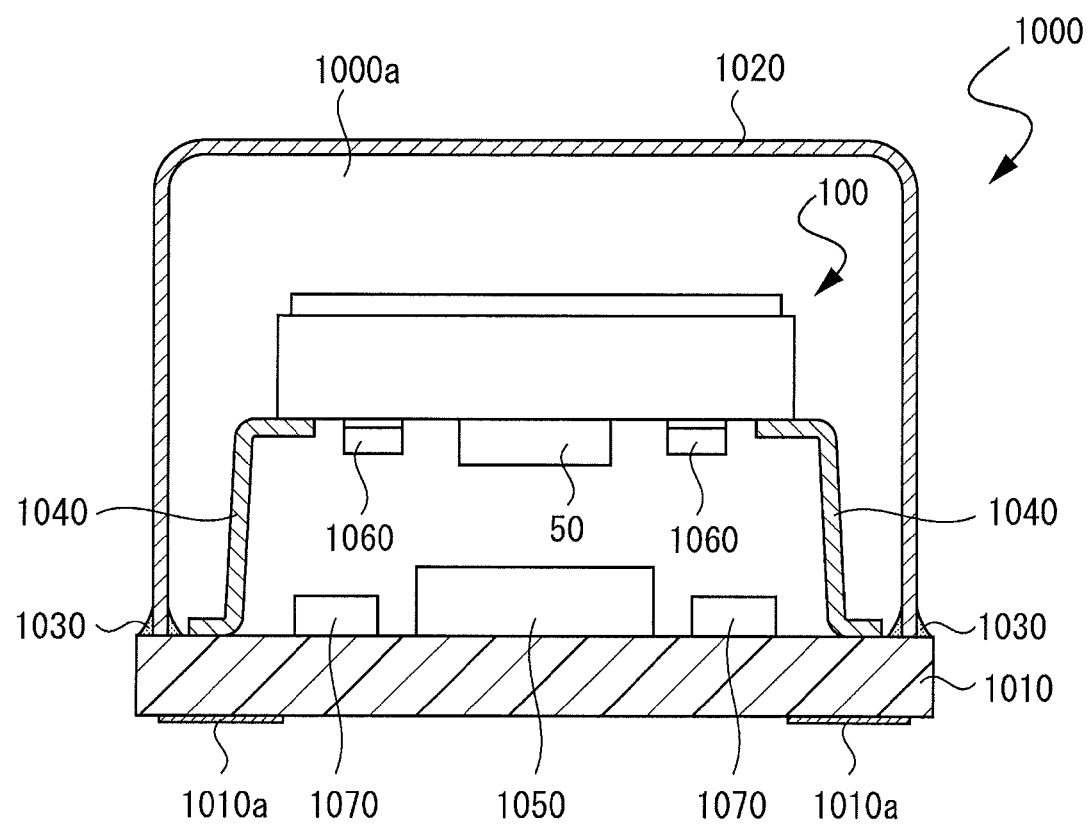
FIG. 8 is a front sectional view schematically illustrating an oscillator according to a fourth embodiment.

Next, with reference to FIG. 8, a description will be made of an oscillator using the vibration device according to a fourth embodiment of the invention. FIG. 8 is a front sectional view schematically illustrating a configuration of an oscillator 1000 using the vibration device according to the fourth embodiment of the invention. A vibrating device used in the oscillator 1000 of the present embodiment has the same configuration as that of the vibration device 100 of the first embodiment. Therefore, in the following description, the same reference numerals are given to the vibration device 100, and detailed description thereof will be omitted.

The oscillator 1000 illustrated in FIG. 8 includes an internal space 1000a formed by a cap 1020 made of a metal or a resin, covering a printed board 1010. The cap 1020 is joined onto the printed board 1010 by using a joining member 1030 such as a solder or an adhesive. The internal space 1000a may not be air-tight, that is, may be open to the atmosphere, or may be an air-tight space. The internal space 1000a is provided with the vibration device 100 which is connected to the printed board 1010 via a connection plate 1040, and a circuit element 1050 connected to the printed board 1010. The vibration device 100 is disposed so as to oppose the printed board 1010, and is connected to the printed board 1010 via the connection plate 1040. The connection plate 1040 has a function of electrically connecting the vibration device 100 to the printed board 1010. The circuit element 1050 has at least a function of controlling the heating element 50 provided in the vibration device 100. Another circuit constituent component 1060 may be provided on the rear surface of the vibration device 100. An electronic component 1070 may be provided on the printed board 1010 in addition to the circuit element 1050. An external connection terminal 1010a is provided on a rear surface (outer surface) of the printed board 1010. The external connection terminal 1010a is electrically connected to the circuit element 1050, the electronic component 1070, and the like (not illustrated).

The oscillator 1000 according to the fourth embodiment achieves the same effect as that of the vibration device 100 of the above-described first embodiment, and it is possible to provide the oscillator 1000 which is hardly influenced by stress such as an impact force from the outside and also to provide the oscillator 1000 using the vibration device 100 which can minimize a frequency variation due to a temperature change in a user environment, that is, which can improve accuracy of so-called frequency-temperature characteristics. In other words, it is possible to provide the oscillator 1000 which can reduce characteristic variations due to a temperature change in a use environment. In the fourth embodiment, the oscillator 1000 has been described as an example, but the same configuration is applicable to a so-called temperature compensation type oscillator on which the circuit element 1050 is not mounted.

Modification Example of Plate Spring

Figure 9A:
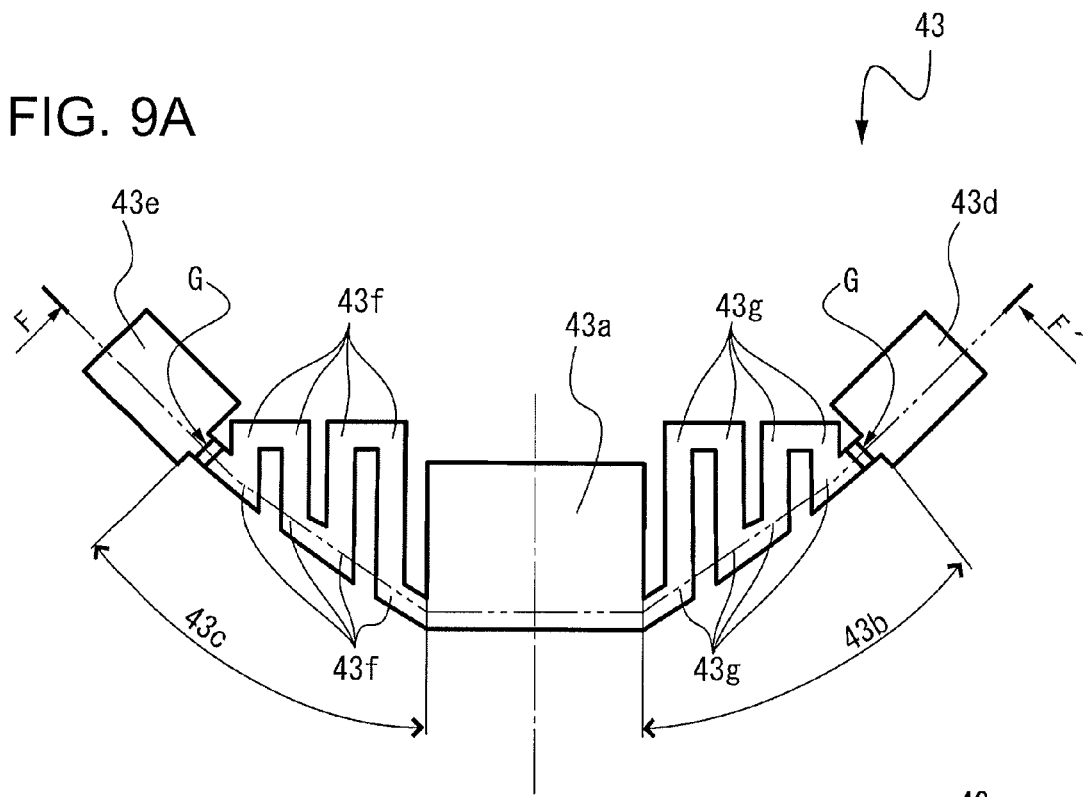
Figure 9B:
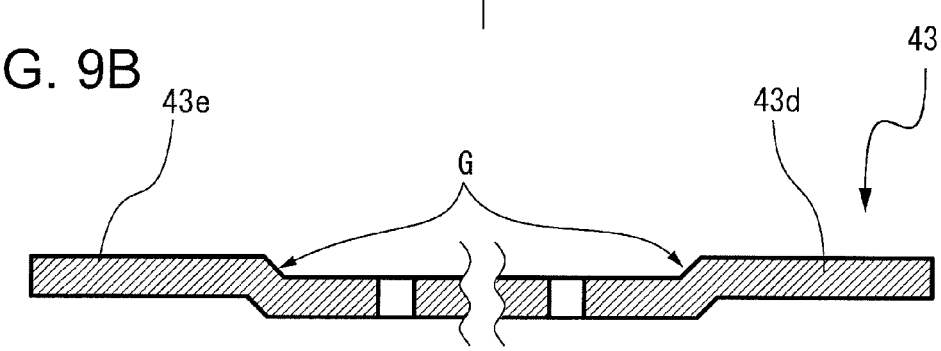

Next, with reference to FIGS. 9A and 9B, a modification example of the plate spring will be described. FIGS. 9A and 9B illustrate a modification example of the plate spring, in which FIG. 9A is a plan view and FIG. 9B is a partially enlarged sectional view taken along the line F-F' illustrated in FIG. 9A. In the above-described embodiment, the tabular plate springs 41 and 42 have been described as an example with reference to FIGS. 3A and 3B, but a plate spring is not limited to having a tabular shape. For example, as illustrated in FIGS. 9A and 9B, a plate spring 43 may be provided with a step section G which is step-processed (depressed) in a plate thickness direction and is bent. In the plate spring 43, the step section G is provided at respective distal ends of a first support arm 43b and a second support arm 43c extending from a base 43a. A first support portion 43d is provided at a portion of the step section G of the first support arm 43b, and a second support portion 43e is provided at a portion of the step section G of the second support arm 43c. The step section G may not be provided at the respective distal ends of the first support arm 43b and the second support arm 43c. For example, a bent section may be provided at other locations, or a plurality of bent sections may be provided.

Since the step-processed step section G is provided as in the plate spring 43, the plate spring 43 is in contact with the vibrating element 30 only at the positions of the first support portion 43d and the second support portion 43e, and thus it is possible to reduce the possibility that the first support arm 43b, the second support arm 43c, and the base 43a may come into contact with the vibrating element 30. In other words, it is possible to reduce an influence on vibration characteristics due to unnecessary contact between the first support arm 43b and the second support arm 43c, and the vibrating element 30.

Fifth Embodiment

Next, with reference to FIGS. 10 to 12, a detailed description will be made of electronic apparatuses to which any one of the vibration devices 100, 200 and 300, and the oscillator 1000 according to the above-described embodiments is applied. The description will be made of an example in which the vibration device 100 including the vibrating element 30 is applied.

Figure 10:
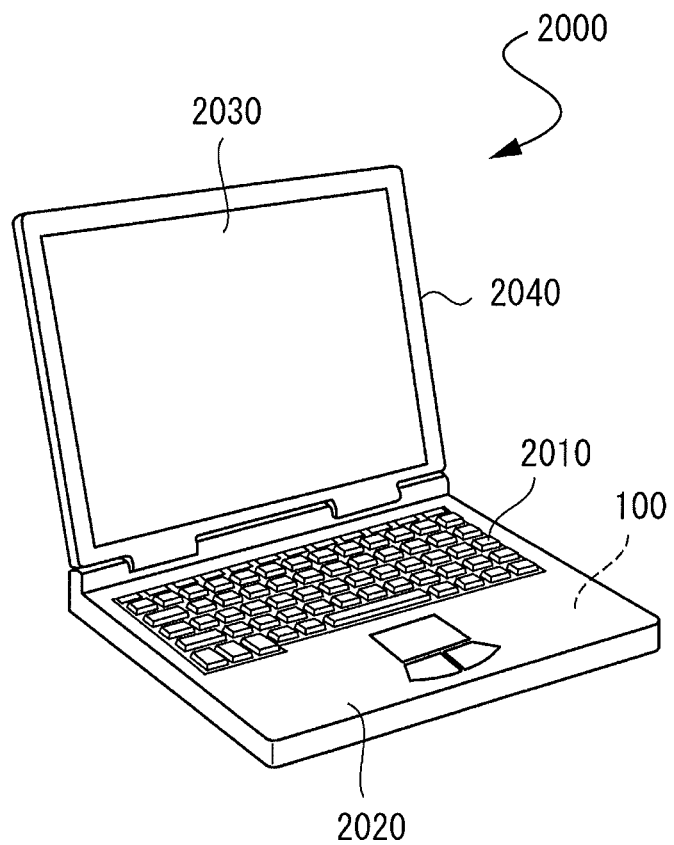
FIG. 10 is a perspective view schematically illustrating a configuration of a personal computer as an electronic apparatus according to a fifth embodiment.

FIG. 10 is a perspective view schematically illustrating a configuration of a mobile type (or a notebook type) personal computer as an electronic apparatus including the vibration device 100 according to one embodiment of the invention. In FIG. 10, a personal computer 2000 is constituted by a main body portion 2020 having a keyboard 2010 and a display unit 2040 having a display portion 2030, and the display unit 2040 is supported so as to be rotatably moved with respect to the main body portion 2020 via a hinge structure portion. The personal computer 2000 includes the vibration device 100, built thereinto, which functions as a timing source for signal processing.

Figure 11:
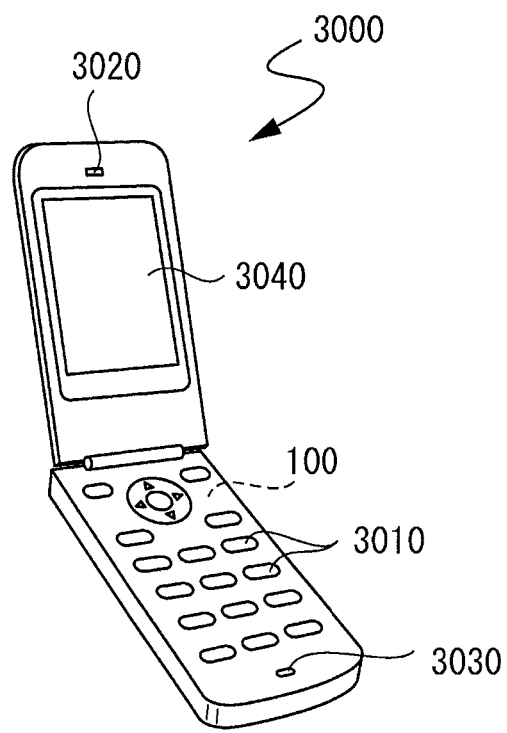
FIG. 11 is a perspective view schematically illustrating a configuration of a mobile phone as an electronic apparatus according to the fifth embodiment.

FIG. 11 is a perspective view schematically illustrating a configuration of a mobile phone (including PHS) as an electronic apparatus including the vibration device 100 according to one embodiment of the invention. In FIG. 11, a mobile phone 3000 includes a plurality of operation buttons 3010, an earpiece 3020, and a mouthpiece 3030, and a display portion 3040 is disposed between the operation buttons 3010 and the earpiece 3020. The mobile phone 3000 includes the vibration device 100, built thereinto, which functions as a timing source for signal processing.

Figure 12:
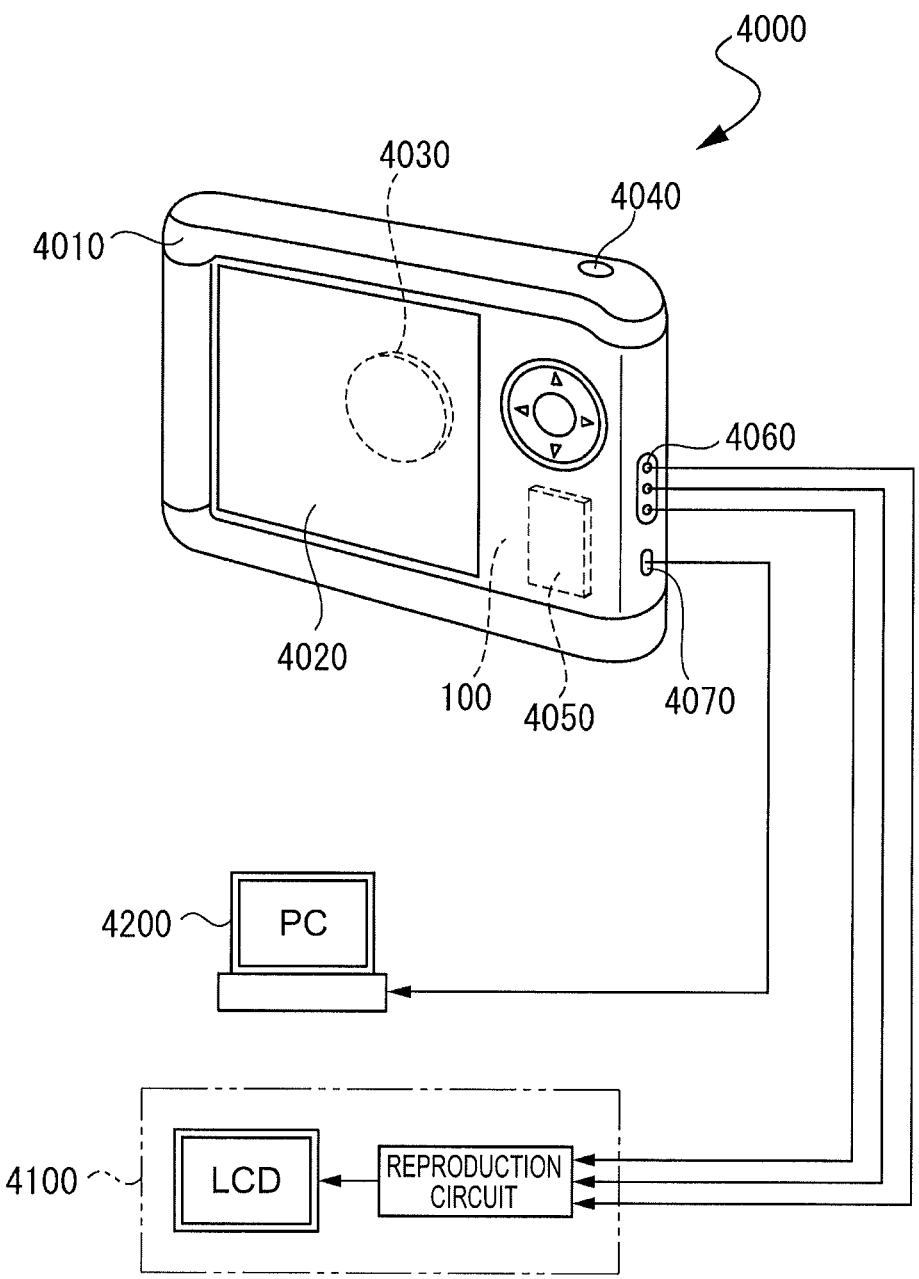
FIG. 12 is a perspective view schematically illustrating a configuration of a digital still camera as an electronic apparatus according to the fifth embodiment.

FIG. 12 is a perspective view illustrating a configuration of a digital still camera as an electronic apparatus including the vibration device 100 according to one embodiment of the invention. In FIG. 12, connection to an external apparatus is also briefly illustrated. Here, a film camera of the related art exposes a silver halide photography film to light using a light image of a subject, whereas the digital still camera 4000 performs photoelectric conversion on a light image of a subject by using an imaging device such as a charge coupled device (CCD) so as to generate an imaging signal (image signal).

A display portion 4020 is provided on a rear side of a case (body) 4010 of the digital still camera 4000 and performs display on the basis of an imaging signal generated by the CCD, and the display portion 4020 functions a view finder which displays a subject as an electronic image. In addition, a light sensing unit 4030 which includes an optical lens (imaging optical system), a CCD, and the like is provided on a front side (the rear side in FIG. 12) of the case 4010.

When a photographer confirms a subject image displayed on the display portion 4020 and presses a shutter button 4040, an imaging signal of the CCD at this point is transmitted to and stored in a memory 4050. In this digital still camera 4000, video signal output terminals 4060 and input and output terminals 4070 for data communication are provided on a side surface of the case 4010. As illustrated in FIG. 12, the video signal output terminals 4060 are connected to a television monitor 4100 and the input and output terminals 4070 for data communication are connected to a personal computer (PC) 4200 as necessary. An imaging signal stored in the memory 4050 is output to the television monitor 4100 or the personal computer 4200 through a predetermined operation. The digital still camera 4000 includes the vibration device 100, built thereinto, which functions as a timing source for signal processing.

The vibration device 100 according to one embodiment of the invention is applicable not only to the personal computer (a mobile type personal computer) of FIG. 10, the mobile phone of FIG. 11, and the digital still camera of FIG. 12, but also to electronic apparatuses, for example, an ink jet type ejection apparatus (for example, an ink jet printer), a laptop type personal computer, a tablet type personal computer, a television, a video camera, a video tape recorder, a car navigation apparatus, a real-time clock apparatus, a pager, an electronic organizer (including a communication function), an electronic dictionary, an electronic calculator, an electronic gaming machine, a wordprocessor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, an apparatus for a mobile communication base station, a storage area network apparatus such as a router or a switch, a local area network apparatus, a network transmission apparatus, a head mounted display, a motion tracer, a motion tracker, a motion controller, and a pedestrian dead reckoning (PDR) apparatus. The oscillator 1000 or the like using the vibration device 100 including the heating element 50 described in the fourth embodiment is suitably applicable to an electronic apparatus used under severe conditions in a temperature environment such as that in a communication base station.

Sixth Embodiment

Figure 13:
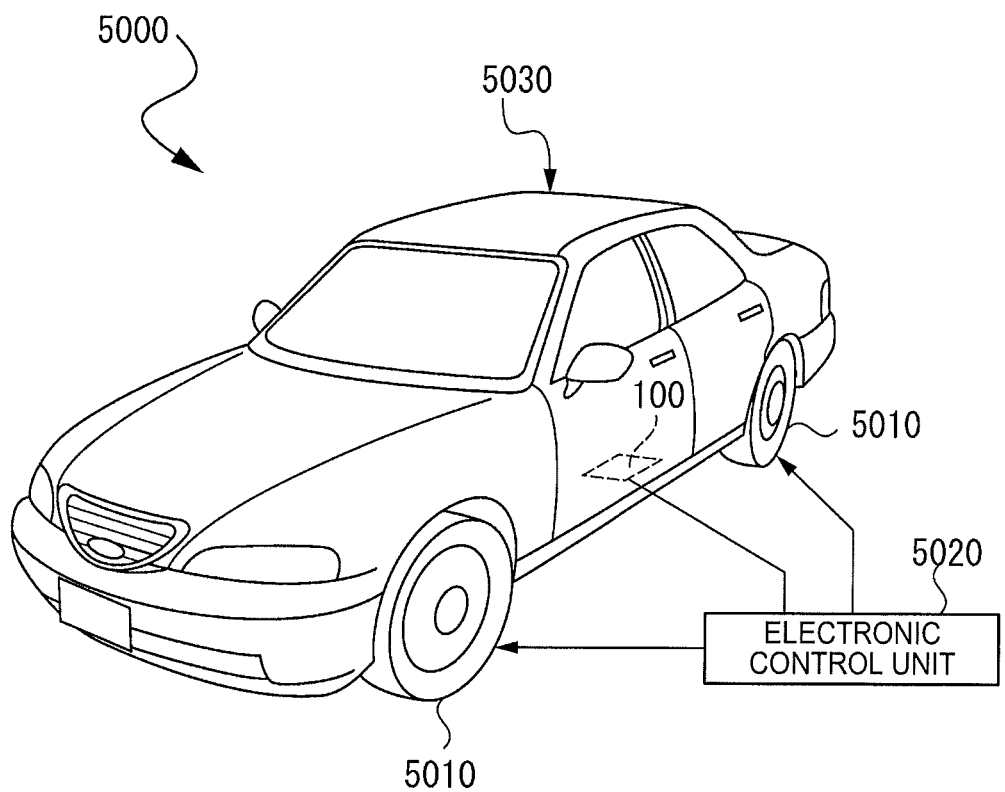
FIG. 13 is a perspective view schematically illustrating a configuration of an automobile as a mobile object according to a sixth embodiment.

FIG. 13 is a perspective view schematically illustrating an automobile as an example of a mobile object according to a sixth embodiment. The vibration device 100 according to one embodiment of the invention is mounted in an automobile 5000. For example, as illustrated in FIG. 13, the vibration device 100 which controls tires 5010 and the like is built into the automobile 5000 as a mobile object, and an electronic control unit 5020 is mounted in a car body 5030. The vibration device 100 is widely applicable to electronic control units (ECU) such as a keyless entry, an immobilizer, a car navigation system, a car air conditioner, an antilock brake system (ABS), an air bag, a tire pressure monitoring system (TPMS), engine control, a brake system, a battery monitor of a hybrid car or an electric car, and a vehicle dynamic control system.

What is claimed is:

1. A vibration device comprising:
a substrate;
a plurality of elastic members each of which includes a connection portion connected to a first surface of the substrate, and a plurality of support portions extending laterally from the connection portion to a position separated from the connection portion; and
a vibrating element that is supported at the support portions,
the vibrating element being supported by the plurality of elastic members via three or more of the support portions.

2. The vibration device according to claim 1,
wherein the elastic member includes a spring member that extends in an elongated shape in a plan view and is provided with a bent section.

3. The vibration device according to claim 1,
wherein the vibrating element has a circular shape in a plan view, and the support portions are disposed in point symmetry with respect to a center of the circular shape.

4. The vibration device according to claim 2,
wherein the vibrating element has a circular shape in a plan view, and the support portions are disposed in point symmetry with respect to a center of the circular shape.

5. The vibration device according to claim 1,
wherein the vibrating element includes excitation electrodes on surfaces which are front and rear surfaces with respect to each other, and
wherein the elastic member is conductive, and at least one of the three or more support portions is connected to at least one of the excitation electrodes via a conductive joining member.

6. The vibration device according to claim 2,
wherein the vibrating element includes excitation electrodes on surfaces which are front and rear surfaces with respect to each other, and
wherein the elastic member is conductive, and at least one of the three or more support portions is connected to at least one of the excitation electrodes via a conductive joining member.

7. The vibration device according to claim 3,
wherein the vibrating element includes excitation electrodes on surfaces which are front and rear surfaces with respect to each other, and
wherein the elastic member is conductive, and at least one of the three or more support portions is connected to at least one of the excitation electrodes via a conductive joining member.

8. The vibration device according to claim 1,
wherein the vibrating element includes excitation electrodes on surfaces which are front and rear surfaces with respect to each other, and
wherein one of the excitation electrodes is electrically connected to a connection electrode formed on the first surface by using wire bonding.

9. The vibration device according to claim 2,
wherein the vibrating element includes excitation electrodes on surfaces which are front and rear surfaces with respect to each other, and
wherein one of the excitation electrodes is electrically connected to a connection electrode formed on the first surface by using wire bonding.

10. The vibration device according to claim 3,
wherein the vibrating element includes excitation electrodes on surfaces which are front and rear surfaces with respect to each other, and
wherein one of the excitation electrodes is electrically connected to a connection electrode formed on the first surface by using wire bonding.

11. The vibration device according to claim 1,
wherein the vibrating element includes excitation electrodes on surfaces which are front and rear surfaces with respect to each other,
wherein the elastic member is conductive, and at least one of the three or more support portions is connected to one of the excitation electrodes via a conductive joining member, and
wherein the other of the excitation electrodes is electrically connected to a connection electrode formed on the first surface by using wire bonding.

12. The vibration device according to claim 2,
wherein the vibrating element includes excitation electrodes on surfaces which are front and rear surfaces with respect to each other,
wherein the elastic member is conductive, and at least one of the three or more support portions is connected to one of the excitation electrodes via a conductive joining member, and
wherein the other of the excitation electrodes is electrically connected to a connection electrode formed on the first surface by using wire bonding.

13. The vibration device according to claim 3,
wherein the vibrating element includes excitation electrodes on surfaces which are front and rear surfaces with respect to each other,
wherein the elastic member is conductive, and at least one of the three or more support portions is connected to one of the excitation electrodes via a conductive joining member, and
wherein the other of the excitation electrodes is electrically connected to a connection electrode formed on the first surface by using wire bonding.

14. The vibration device according to claim 1,
wherein a heating member is provided on a second surface which is a rear surface of the first surface of the substrate.

15. The vibration device according to claim 2,
wherein a heating member is provided on a second surface which is a rear surface of the first surface of the substrate.

16. The vibration device according to claim 3,
wherein a heating member is provided on a second surface which is a rear surface of the first surface of the substrate.

17. The vibration device according to claim 1,
wherein a lid body forming a storage space which stores the vibrating element therein is joined to the first surface of the substrate, and
wherein the storage space is air-tightly sealed.

18. An electronic apparatus comprising the vibration device according to claim 1.

19. A mobile object comprising the vibration device according to claim 1.

20. A vibration device comprising:
a substrate;
a plurality of elastic members each of which includes a connection portion connected to a first surface of the substrate, and a plurality of support portions extending laterally from the connection portion to a position separated from the connection portion; and
a vibrating element that is supported at the support portions,
the vibrating element being supported by the plurality of elastic members via the support portions, at least one of the support portions being connected to the vibrating element by a conductive joining member and at least one other of the support portions being connected to the vibrating member by a non-conductive joining member.

21. The vibration device according to claim 1,
wherein the connection portion has one end and an opposite end such that the plurality of support portions extend from both ends of the connection portion to the position separated from the connection portion.

* * * * *